(12) United States Patent
Yoon et al.

(10) Patent No.: US 6,458,668 B1
(45) Date of Patent: Oct. 1, 2002

(54) METHOD FOR MANUFACTURING HETERO JUNCTION BIPOLAR TRANSISTOR

(75) Inventors: Tae Ho Yoon, Taejeon-Kwangyeoksi (KR); Sang Hoon Cheon, Taejeon-Kwangyeoksi (KR); Song Cheol Hong, Taejeon-Kwangyeoksi (KR); Heung Seob Koo, Taejeon-Kwangyeoksi (KR); Sea Houng Cho, Taejeon-Kwangyeoksi (KR)

(73) Assignees: Telephus, Inc., Seoul (KR); Korea Advanced Institute of Science and Technology, Taejeon-Kwangyeoksi (KR)

( * ) Notice: Subject to any disclaimer, the term of this patent is extended or adjusted under 35 U.S.C. 154(b) by 0 days.

(21) Appl. No.: 09/653,034

(22) Filed: Sep. 1, 2000

(30) Foreign Application Priority Data

Jul. 24, 2000 (KR) .......................... 2000-42488

(51) Int. Cl.$^7$ ............................... H01L 21/331
(52) U.S. Cl. ................... 438/312; 438/314; 438/330; 438/354; 438/235
(58) Field of Search .................................. 438/312, 314, 438/330, 354, 235

(56) References Cited

U.S. PATENT DOCUMENTS

| | | | | |
|---|---|---|---|---|
| 5,389,554 A | * | 2/1995 | Liu et al. | |
| 5,668,388 A | * | 9/1997 | Delage et al. | 257/197 |
| 5,859,447 A | * | 1/1999 | Yang et al. | 257/197 |
| 6,031,255 A | * | 2/2000 | Delage et al. | 257/198 |
| 6,043,520 A | * | 3/2000 | Yamamoto | 257/198 |
| 6,081,003 A | * | 6/2000 | Miyakuni et al. | 257/197 |

\* cited by examiner

*Primary Examiner*—Trung Dang
(74) *Attorney, Agent, or Firm*—Head, Johnson and Kachigian

(57) ABSTRACT

Disclosed is a method for manufacturing a hetero junction bipolar transistor capable of forming a ledge by using a low-priced contact aligner and in a selective wet etching manner, without having any expensive stepper and dry etching and forming a ballasting resistor, without having an additional NiCr thin film, whereby the manufacturing processes thereof can be embodied in simple and easy manners, thereby improving productivity and an economical efficiency.

13 Claims, 10 Drawing Sheets

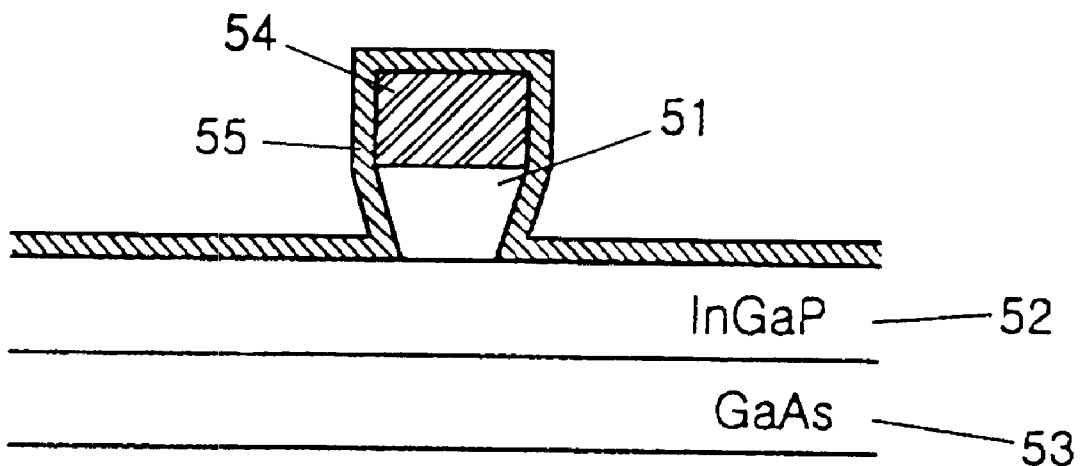

METHOD FOR MANUFACTURING HETERO JUNCTION BIPOLAR TRANSISTOR

BACKGROUND OF THE INVENTION

1. Field of the Invention

The present invention relates to a hetero junction bipolar transistor and more particularly, to a method for manufacturing a hetero junction bipolar transistor capable of forming a ledge in a simple manner and producing a ballasting resistor without any process of forming a NiCr thin film, whereby the manufacturing process thereof is carried out in simple and easy manners, thereby improving productivity and an economical efficiency.

2. Description of the Related Art

With the drastic extension of a wireless communication network market, recently, a wireless communication using a microwave band began to emerge and thus, resulted in the giving of much attention on the development of a very high frequency device and the miniaturization and high performance pursuit thereof.

Specifically, Si—BiCMOS, SiGe hetero junction bipolar transistor (HBT), GaAs field effect transistor (FET), AlGaAs/GaAs HBT and so on are competed, as a power device used in a transmitting-part of a wireless communication system, and in case of a wireless communication terminal, at present, the above-mentioned AlGaAs/GaAs hetero junction bipolar transistor is widely used over all of the markets. This is because the AlGaAs/GaAs hetero junction bipolar transistor uses a single power and has an excellent linearity. On the other hand, the hetero junction bipolar transistor has a poor thermal characteristic, which has been solved by the formation of a ballasting resistor.

FIGS. 1a to 1g are sectional views illustrating the processes of manufacturing a conventional hetero junction bipolar transistor (HBT) for power purpose. As shown in FIG. 1a, a substrate, which is composed of an InGaAs/GaAs layer 1, an AlGaAs layer 2 and a GaAs layer 3, is first prepared. In this case, the laminated structure of the AlGaAs/GaAs hetero junction bipolar transistor is formed by the AlGaAs layer 2 and the GaAs layer 3. Then, as shown in FIG. 1b, an emitter metal 4 is formed on the InGaAs/GaAs layer 1 in a vacuum evaporation manner and by using the emitter metal 4 as a masking material, as shown in FIG. 1c, the wet etching process for the InGaAs/GaAs layer 1 is carried out. Next, so as to form a ledge, a patterning process is carried out by using a photoresist 5. Namely, as shown in FIG. 1d, the patterning of a length of 0.2 μm on the basis of the bottom end of the emitter metal 4 is made by using a stepper. The substrate where the patterning is completed by using the corresponding photoresist 5 is subjected to a dry etching and thus, as shown in FIG. 1e, the AlGaAs layer 2 is etched. Also, the substrate is subjected to a somewhat wet etching treatment and a base metal 6 is thus formed in a vacuum evaporation manner on the corresponding etched portion, as shown in FIG. 1f. Next, the photoresist 5 lifts off and as shown in FIG. 1g, the base 6 is then formed. Thereafter, through a vacuum evaporation process of a collector metal and back-end process, a device is formed as shown in FIG. 2. On the other hand, since the hetero junction bipolar transistor should have a ballasting resistor to ensure a thermal characteristic thereof, the ballasting resistor is formed on the emitter or base by using an NiCr thin film as shown in FIG. 3. The final hetero junction bipolar transistor has the equivalent circuit as shown in FIG. 4.

The key processes in manufacturing the conventional hetero junction bipolar transistor device for power purpose are to form the ledge on the emitter and to form the ballasting resistor to compensate for the thermal characteristic. The ledge is the most important element to determine the characteristic and reliability of the hetero junction bipolar transistor, which plays a role in separating the electrons injected in the emitter and the exposed semiconductor boundary surface by a predetermined distance. If the distance is too short, the electrons are trapped on the exposed semiconductor surface, thereby destructing the surface, such that the device characteristic drastically deteriorates. Therefore, the distance is desirably ranged over 0.1 μm. To the contrary, if the distance is too large, the base resistance becomes high. Therefore, in the conventional AlGaAs/GaAs hetero junction bipolar transistor manufacturing process the patterning of the distance of 0.2 μm is carried out by using a stepper, as shown in FIG. 1d and the dry etching is then carried out to form the ledge. However, even the dry etching method is not easy to adjust the etching thickness of hundreds of Å and the semiconductor surface is also damaged after etching, such that the wet etching treatment should be carried out after the completion of the dry etching. And, the ballasting resistor, which functions to compensate for the thermal characteristic of the hetero junction bipolar transistor element, should be formed on the emitter or base by using the NiCr thin film as shown in FIG. 3.

The conventional hetero junction bipolar transistor manufacturing method arises some problems that the manufacturing processes are complicated to thereby reduce the economical efficiency and productivity thereof, because the patterning is carried out by using an expensive stepper and then, after the application of the dry etching the wet etching should be carried out, for the purpose of forming the ledge, and that the manufacturing processes are more complicated to thereby decrease the productivity thereof, because an additional NiCr thin film is formed for the purpose of forming the ballasting resistor.

SUMMARY OF THE INVENTION

It is, therefore, an object of the present invention to provide a method for manufacturing a hetero junction bipolar transistor capable of forming a ledge by using a low-priced contact aligner and in a selective wet etching manner, without having any expensive stepper and dry etching, and forming a ballasting resistor, without having an additional NiCr thin film, whereby the manufacturing processes can be embodied in simple and easy manner, thereby improving productivity and an economical efficiency.

To attain the above-stated object, there is provided a method for manufacturing a hetero junction bipolar transistor comprising the steps of: (a) forming an emitter metal in a vacuum evaporation manner on a substrate composed of an upper InGaAs/GaAs layer, an intermediate InGaP layer, and a lower GaAs layer; (b) carrying out a selective wet etching on the InGaAs/GaAs layer by using the emitter metal as a masking material; (c) forming a thin film of a material selected from the group consisting of $Si_3N_4$, $SiO_2$ and TiW on the surface of the emitter metal and the InGaP layer, in the vacuum evaporation manner; (d) carrying out patterning of a photoresist on the thin film by using a contact aligner to form a base opening; (e) carrying out the opening of the thin film positioned on the base opening by the reactive ion etching system; (f) carrying out a wet etching on the intermediate InGaP layer; and (g) forming a base metal in a vacuum evaporation manner and carrying out the lifting off of the photoresist to thereby form base contact.

In the embodiment of the present invention, preferably, a ballasting resistor is adjusted by the distance between the lower end of the emitter metal and the base opening.

In the embodiment of the present invention, the distance between the lower end of the emitter metal and the base opening is preferably at least 2 Am.

In the embodiment of the present invention, preferably, the step (f) of carrying out the wet etching the intermediate InGaP layer comprises forming ledge by selective wet etching the InGaP layer by using the thin film as a masking material.

In the embodiment of the present invention, the InGaP layer is replaced with another material adequate to hetero junction.

BRIEF DESCRIPTION OF THE DRAWINGS

FIGS. 5a to 5i are sectional views illustrating the processes of manufacturing a hetero junction bipolar transistor (HBT) according to the present invention.

DETAILED DESCRIPTION OF THE PREFERRED EMBODIMENT

Now, an explanation of a method for manufacturing a hetero junction bipolar transistor according to the present invention will be hereinafter discussed with reference to accompanying drawings.

FIGS. 5a to 5i show the processes of manufacturing a hetero junction bipolar transistor (HBT) according to the present invention.

Figure 5A:
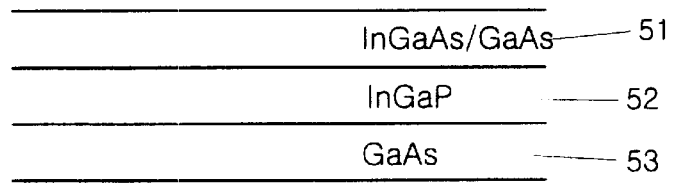
Figure 5B:
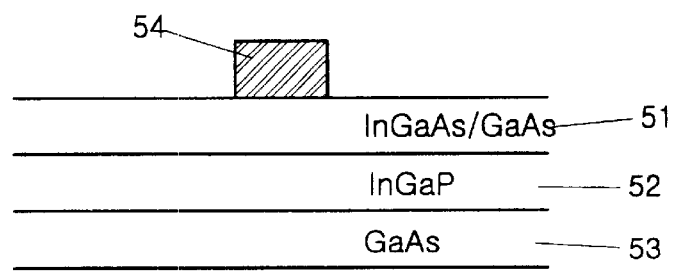
Figure 5C:
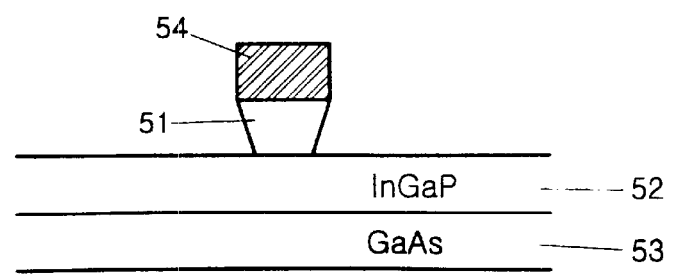
Figure 5E:
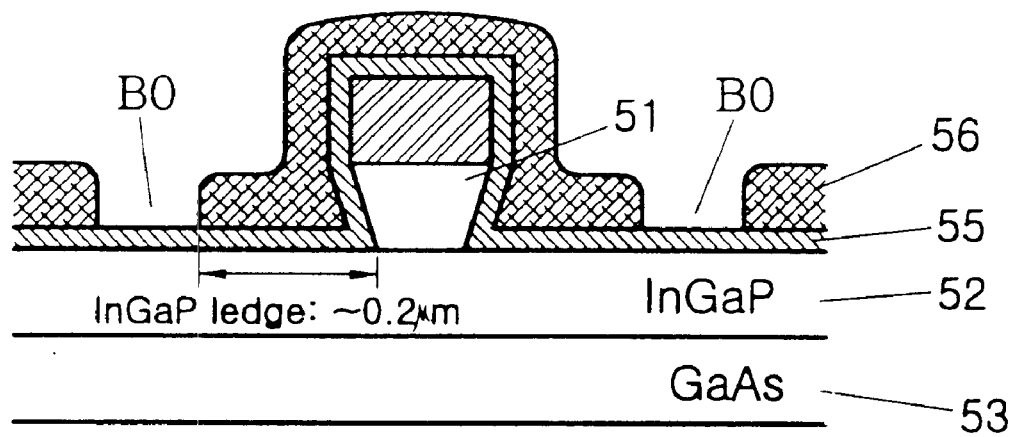
Figure 5F:
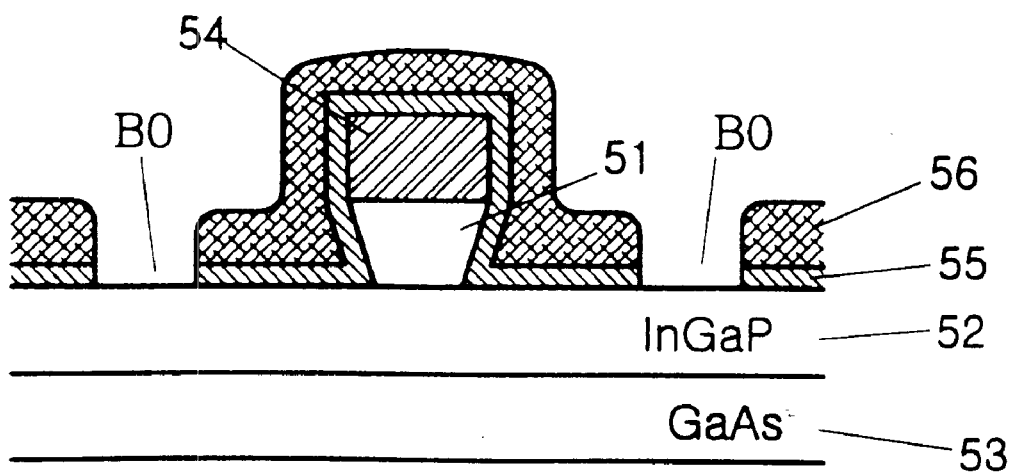
Figure 5G:
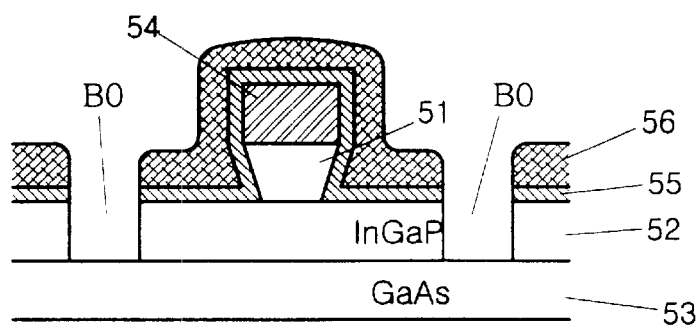
Figure 5H:
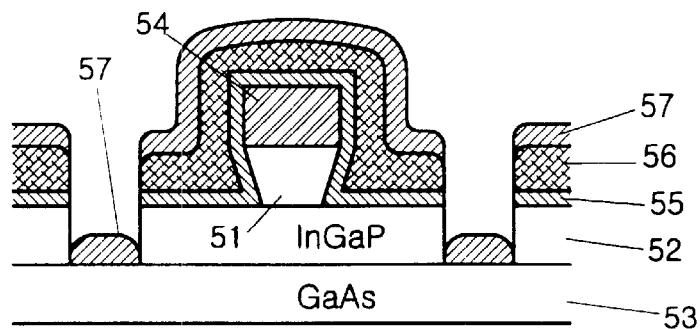
Figure 5I:
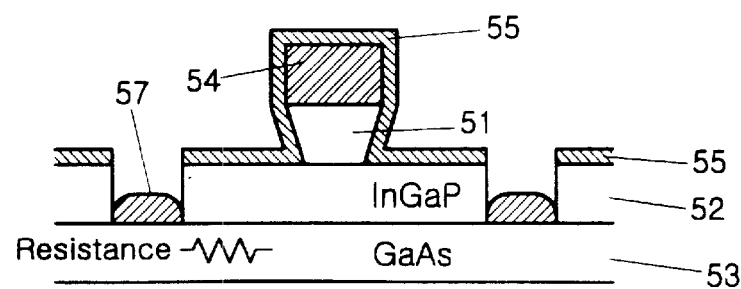

As shown in FIG. 5a, a substrate, which is composed of an InGaAs/GaAs layer 51, an InGaP layer 52 and a GaAs layer 53, is first prepared. In this case, the laminated structure of the InGaP/GaAs hetero junction bipolar transistor is formed by the InGaP layer 52 and the GaAs layer 53. Then, as shown in FIG. 5b, an emitter metal 54 is formed on the InGaAs/GaAs layer 51 in a vacuum evaporation manner and by using the emitter metal 54 as a masking material, as shown in FIG. 5c, the wet etching process for the InGaAs/GaAs layer 51 is carried out. Next, a thin film 55 of a material selected from the group of consisting of $Si_3N_4$, $SiO_2$ and TiW is formed in a vacuum evaporation manner on the whole substrate surface where the emitter metal 54 is formed, as shown in FIG. 5d and so as to form a ledge, a patterning process is carried out by using a photoresist 56. To this end, as shown in FIG. 5e, the pattern of a length of 2 $\mu$m on the basis of the bottom end of the emitter metal 54 is made by using a contact aligner, thereby forming a base opening (BO). Then, the thin film 55, which is positioned on the corresponding base opening(BO), is opened by the reactive ion etching system, as shown in FIG. 5f. In the state where the base opening (BO) has been formed and the thin film 55 positioned on the corresponding base opening (BO) has been opened, the corresponding substrate is subjected to a wet etching treatment and as shown in FIG. 5g, the InGaP layer 52 positioned on the base opening (BO) is thus etched. As shown in FIG. 5h, the base metal 57 is formed in the vacuum evaporation manner and then, the photoresist 56 lifts off, thereby forming the base 57, as shown in FIG. 5i.

Figure 1A:
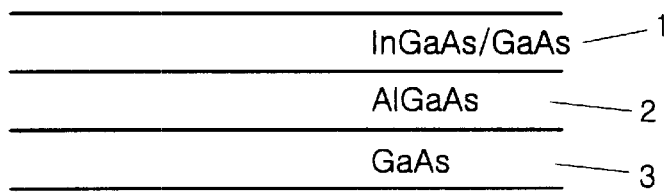
FIGS. 1a to 1g are sectional views illustrating the processes of manufacturing a conventional hetero junction bipolar transistor (HBT)
Figure 1B:
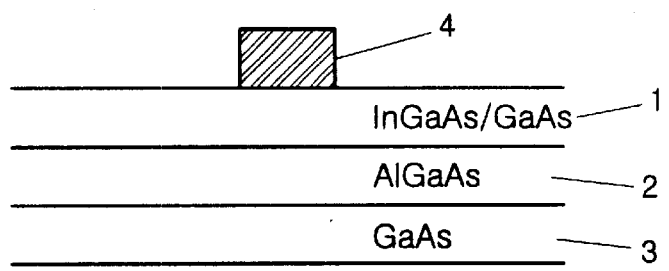
Figure 1C:
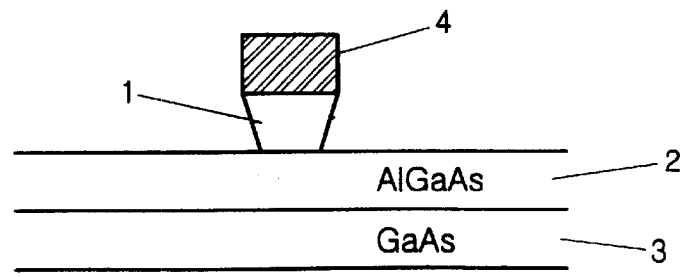
Figure 1D:
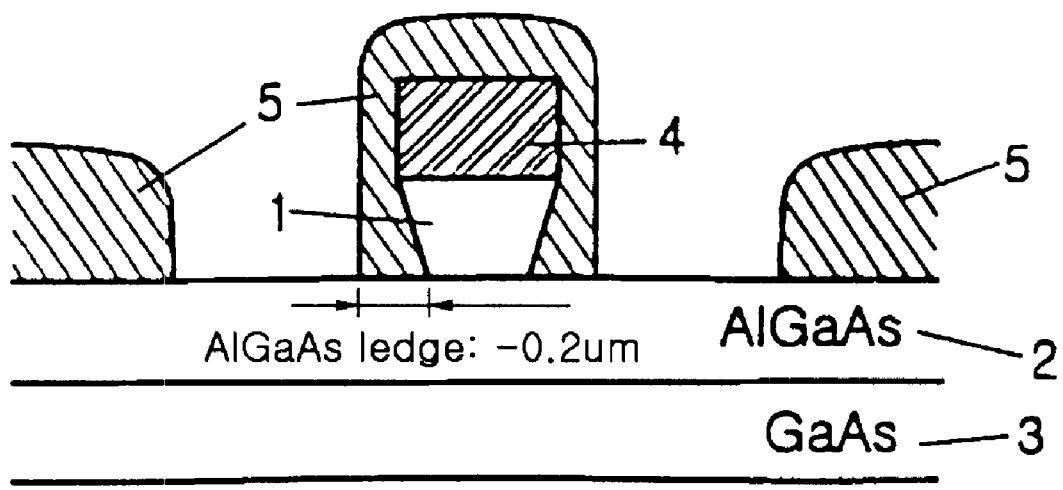
Figure 1E:
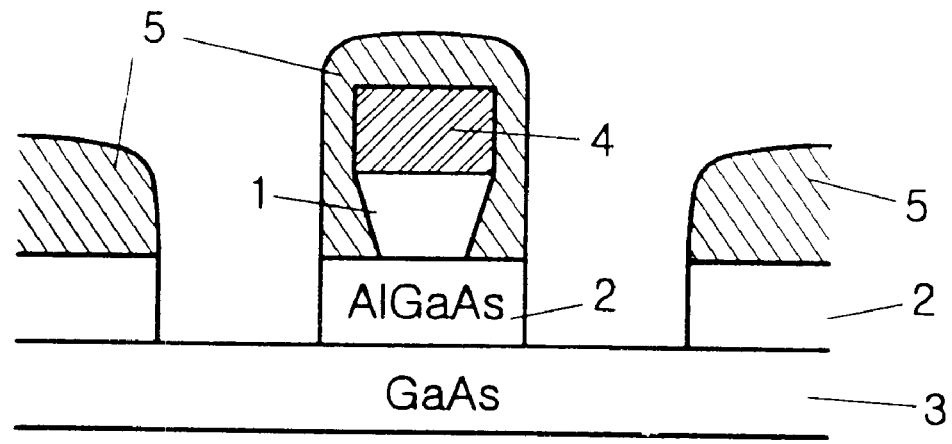
Figure 1F:
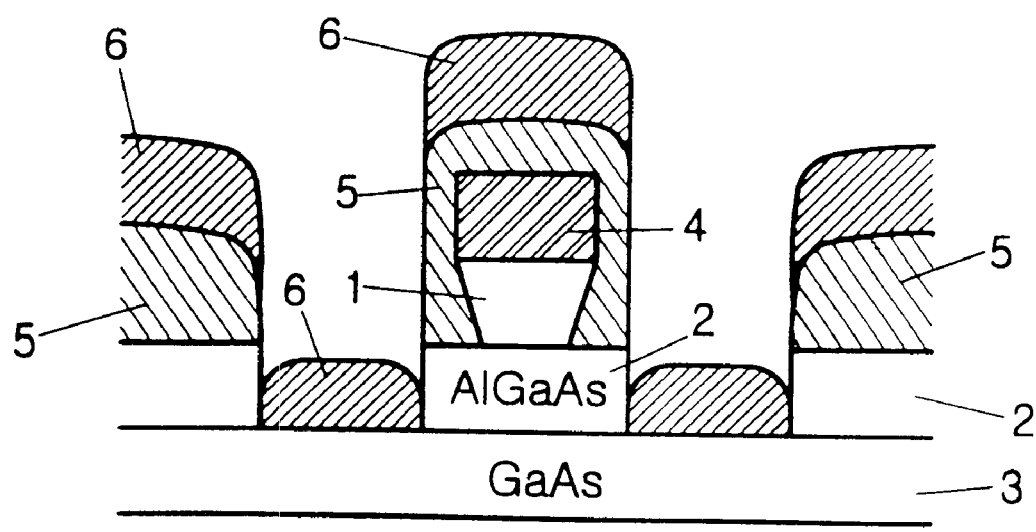
Figure 1G:
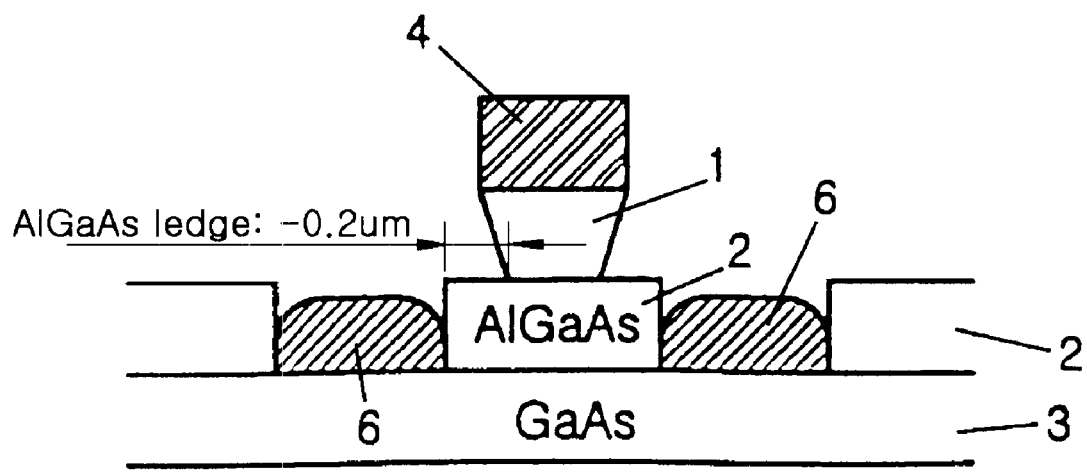
Figure 2:
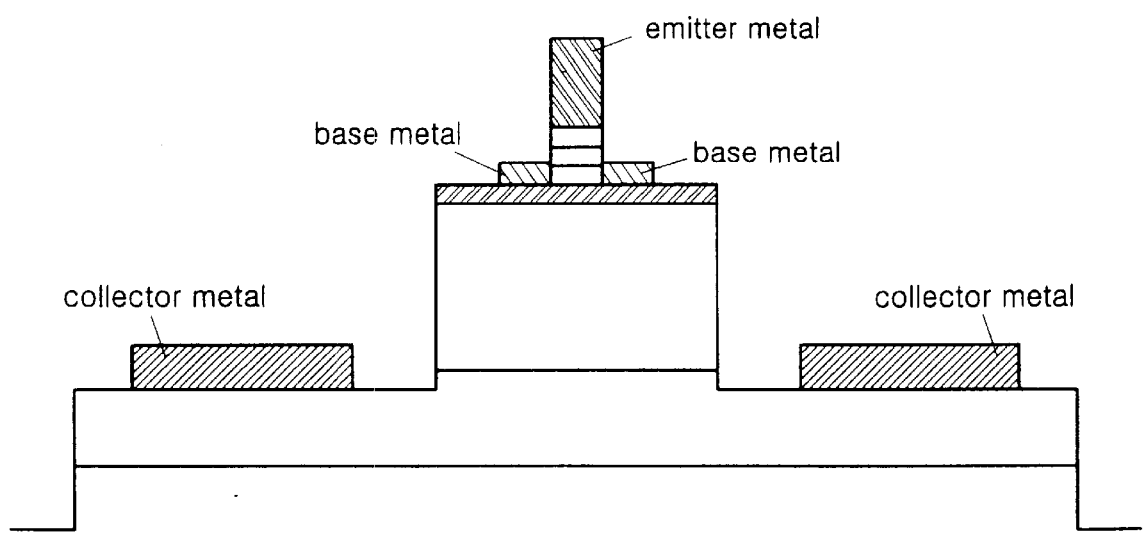
FIG. 2 is a sectional view illustrating the completed hetero junction bipolar transistor in FIGS. 1a to 1g.
Figure 3:
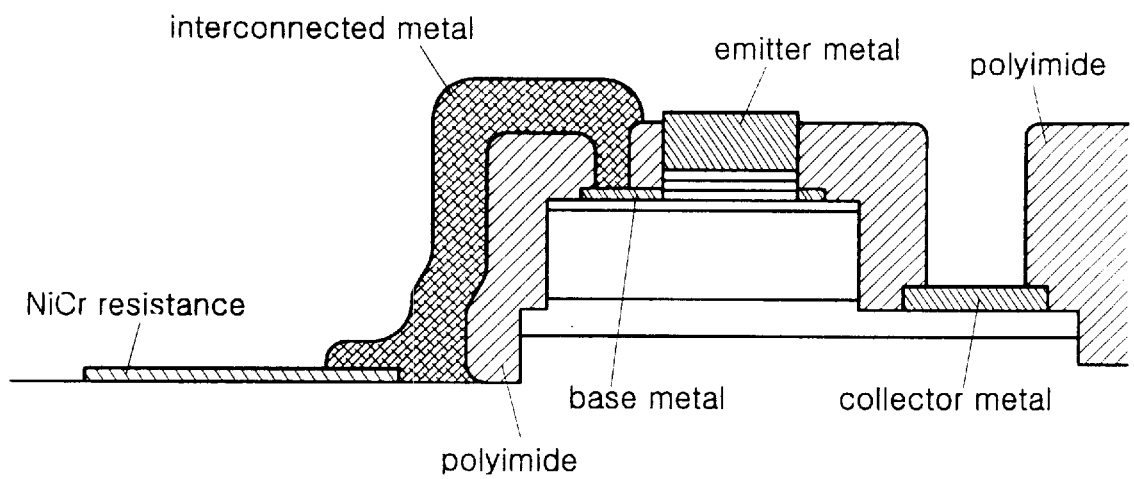
FIG. 3 is a sectional view illustrating the process of forming ballasting resistor of the hetero junction bipolar transistor in FIGS. 1a to 1g.
Figure 4:
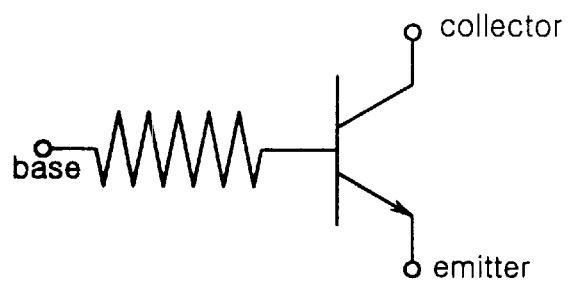
FIG. 4 is an equivalency circuit diagram of the hetero junction bipolar transistor in FIGS. 1a to 1g.

At this time, since the ballasting resistor is formed on the ledge formed by the distance of 2 $\mu$m on the basis of the bottom end of the emitter metal 54, there is no need for an additional process of forming the ballasting resistor. Thereafter, through a vacuum evaporation process of a collector metal and back end processes, a device is formed as shown in FIG. 2. On the other hand, this hetero junction bipolar transistor has the equivalent circuit as shown in FIG. 4.

In the method for manufacturing the hetero junction bipolar transistor according to the present invention, because the InGaP/GaAs material system composed of InGaP layer 52 and the GaAs layer 53 is employed, the selective wet etching for the InGaP material can be carried out. At this time, upon the formation of the ledge the method for manufacturing the hetero junction bipolar transistor according to the present invention does not require any conventional dry etching, the manufacturing process is carried out in simple and easy manner. Also, the InGaP material itself has more excellent thermal characteristic and reliability than the AlGaAs material conventionally used.

Additionally, in the embodiment of the present invention since the ledge is formed in a relatively long length and thus, the base layer is used as the ballasting resistor, the formation of the ledge can be achieved by virtue of a general contact aligner, without using any expensive stepper, thereby improving an economical efficiency.

On the other hand, the substrate composed of the InGaAs/GaAs layer 51, the InGaP layer 52 and the GaAs layer 53 has been described in the embodiment of the present invention, but the InGaP layer 52 may be replaced with another material adequate to the hetero junction.

As described above, a method for manufacturing a hetero junction bipolar transistor is capable of forming a ledge by using a low-priced contact aligner and in a selective wet etching manner, without having any expensive stepper and dry etching, and forming a ballasting resistor, without having an additional NiCr thin film, whereby the manufacturing processes can be embodied in simple and easy manners, thereby improving productivity and an economical efficiency.

While the present invention has been described with reference to a specific embodiment, the description is illustrative of the invention and is not to be construed as limiting the invention. Various modifications may occur to those skilled in the art without departing from the true spirit and scope of the invention.

What is claimed is:

1. A method for manufacturing a hetero junction bipolar transistor, said method comprising the steps of:

(a) forming an emitter metal in a vacuum evaporation manner on a substrate composed of an upper InGaAs/GaAs layer, an intermediate InGaP layer, and a lower GaAs layer;

(b) carrying out a selective wet etching on said InGaAs/GaAs layer by using said emitter metal as a masking material;

(c) forming a thin film of a material selected from the group of consisting of $Si_3N_4$, $SiO_2$ and TiW on the surface of said emitter metal and said InGaP layer, in a vacuum evaporation manner;

(d) carrying out patterning of a photoresist on said thin film by using a contact aligner to form a base opening;

(e) carrying out the opening of said thin film positioned on said base opening in wet and dry etching manners;

(f) carrying out a wet etching said intermediate InGaP layer; and (g) forming a base metal in a vacuum evaporation and carrying out the lifting off of said photoresist to thereby form base contact.

2. The method of claim 1, wherein a ballasting resistor is adjusted by the distance between the lower end of said emitter metal and said base opening.

3. The method of claim 2, wherein said distance between the lower end of said emitter metal and said base opening is at least 2 μm.

4. The method of claim 1, wherein said step (f) of carrying out the wet etching on said intermediate InGaP layer comprises forming ledge by selective wet etching said InGaP layer by using said thin film as a masking material.

5. The method of claim 1, wherein said InGaP layer is replaced with another material adequate to hetero junction.

6. A method of manufacturing a hereto junction bipolar transistor comprising:

forming a substrate piling an InGaAs layer, an InGaP layer, and a second GaAs layer;

forming an emitter pattern on the substrate;

patterning the InGaAs layer and the first GaAs layer;

forming a film layer on the substrate and the emitter pattern;

exposing a base opening by forming a photoresist pattern on the film layer;

patterning the film layer by etching process using the photoresist as etch mask;

patterning the InGaP layer by etching process;

depositing a base material on the photoresist pattern and in base opening; and forming a base pattern by removing the photoresist pattern.

7. The method of claim 6 wherein the emitter pattern and base pattern are metal patterns.

8. The method of claim 6 wherein the process of the patterning the InGaAs layer and the first GaAs layer is a wet etching process.

9. The method of claim 6 wherein the process of the forming the film layer on the substrate is a vacuum evaporation manner.

10. The method of claim 6 wherein the film layer is a material selected from the group of silicon nitride, a silicon oxide and TiW.

11. The method of claim 6 wherein the process of the patterning the film layer is wet etching process.

12. The method of claim 6 wherein the process of the patterning the InGaP layer is wet etching process.

13. The method of claim 6 a distance between the emitter pattern and the base pattern is greater than 2.

* * * * *

UNITED STATES PATENT AND TRADEMARK OFFICE
CERTIFICATE OF CORRECTION

PATENT NO.   : 6,458,668 B1
DATED        : October 1, 2002
INVENTOR(S)  : Yoon et al.

It is certified that error appears in the above-identified patent and that said Letters Patent is hereby corrected as shown below:

<u>Column 5,</u>
Line 20, after "layer," insert -- a first GaAs layer, --

Signed and Sealed this

Twenty-first Day of January, 2003

JAMES E. ROGAN
*Director of the United States Patent and Trademark Office*